(12) United States Patent
Li et al.

(10) Patent No.: US 7,863,186 B2
(45) Date of Patent: Jan. 4, 2011

(54) FULLY AND UNIFORMLY SILICIDED GATE STRUCTURE AND METHOD FOR FORMING SAME

(75) Inventors: Wai-Kin Li, Beacon, NY (US); Haining Yang, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 39 days.

(21) Appl. No.: 12/334,746

(22) Filed: Dec. 15, 2008

(65) Prior Publication Data
US 2009/0090986 A1    Apr. 9, 2009

Related U.S. Application Data

(63) Continuation of application No. 11/566,848, filed on Dec. 5, 2006, now Pat. No. 7,482,270.

(51) Int. Cl.
H01L 21/44    (2006.01)
(52) U.S. Cl. ............... 438/655; 438/683; 257/E21.028; 257/E21.199; 257/E21.438; 977/892
(58) Field of Classification Search .......... 257/E21.259, 257/E21.024, E21.028, E21.199, E21.438, 257/E21.439; 977/892, 888
See application file for complete search history.

(56) References Cited

U.S. PATENT DOCUMENTS

| | | | |
|---|---|---|---|
| 6,281,545 B1 | 8/2001 | Liang et al. | |
| 6,358,813 B1 | 3/2002 | Holmes et al. | |
| 7,482,270 B2 * | 1/2009 | Li et al. | 438/655 |
| 2003/0032269 A1 | 2/2003 | Dobuzinsky et al. | |
| 2005/0272341 A1 | 12/2005 | Colburn et al. | |
| 2006/0011990 A1 | 1/2006 | Furukawa et al. | |
| 2006/0022280 A1 | 2/2006 | Cabral et al. | |
| 2006/0038182 A1 | 2/2006 | Rogers et al. | |
| 2006/0084247 A1 | 4/2006 | Liu | |
| 2006/0263961 A1 * | 11/2006 | Kittl et al. | 438/199 |
| 2007/0004203 A1 * | 1/2007 | Streck et al. | 438/680 |

FOREIGN PATENT DOCUMENTS

| | | |
|---|---|---|
| EP | 1724828 | 11/2006 |
| WO | WO2004114389 | 12/2004 |

OTHER PUBLICATIONS

Guarini K.W. et al: "Process integration of self-assembled polymer templates into silicon nanofabrication", Journal of Vacuum Science and Technology: Part B, AVS/AIP, Melville, NY, vol. 20, No. 6, Nov. 1, 2002, pp. 2788-2792.

* cited by examiner

*Primary Examiner*—Caridad M Everhart
(74) *Attorney, Agent, or Firm*—Howard M. Cohn; Yuanmin Cai

(57) ABSTRACT

Fully and uniformly silicided gate conductors are produced by deeply "perforating" silicide gate conductors with sub-lithographic, sub-critical dimension, nanometer-scale openings. A silicide-forming metal (e.g. cobalt, tungsten, etc.) is then deposited, polysilicon gates, covering them and filling the perforations. An anneal step converts the polysilicon to silicide. Because of the deep perforations, the surface area of polysilicon in contact with the silicide-forming metal is greatly increased over conventional silicidation techniques, causing the polysilicon gate to be fully converted to a uniform silicide composition. A self-assembling diblock copolymer is used to form a regular sub-lithographic nanometer-scale pattern that is used as an etching "template" for forming the perforations.

29 Claims, 8 Drawing Sheets

FULLY AND UNIFORMLY SILICIDED GATE STRUCTURE AND METHOD FOR FORMING SAME

CROSS REFERENCE TO RELATED APPLICATIONS

This application is a continuation of commonly-owned, U.S. patent application Ser. No. 11/566,848 filed on entitled FULLY AND UNIFORMLY SILICIDED GATE STRUCTURE AND METHOD FOR FORMING SAME, and filed on Dec. 5, 2006.

TECHNICAL FIELD

The present invention relates to the formation of transistor structures in semiconductor devices, and more particularly to the formation of silicide conductors in MOS/CMOS (Metal-Oxide-Semiconductor/Complementary Metal-Oxide-Semiconductor) devices.

BACKGROUND ART

As designs of complex integrated semiconductor devices have evolved, there has been constant demand for greater function, increased performance and decreased power consumption in a single device. In order to meet these demands, designers have found ways to shrink transistor geometries, reduce parasitic effects and leakages, and increase speeds. Each time a specific technology reaches its limits of performance, designers come up with new technologies and design strategies to permit a whole new generation of smaller, denser, more efficient semiconductor devices. This pattern of continual evolution in semiconductor device design has continued essentially unabated for nearly four decades and shows no signs of stopping.

At present, critical dimensions in semiconductor fabrication processes have been reduced into the deep sub-micron range. Downscaling of certain critical dimensions, (e.g., gate length of a MOS transistor), however, has a cost: the degradation of related device characteristics. Often this degradation is significant enough that the advantages obtained by decreasing feature sizes may be offset. By way of example: as the thickness of gate dielectrics has been reduced (now well under 20 angstroms in thickness), one result has been increased gate leakage currents and increased diffusion of dopants from polysilicon gate structures (often referred to as the "poly depletion effect"). Alternatives to doped polysilicon, such as metals and silicides, are now being used in gate structures to mitigate the poly depletion effect and control the leakage current, and thus to ensure electrical performance in highly integrated CMOS devices.

Silicides are alloys of silicon and metals. In modern semiconductor processing, it has become increasingly common to use silicides as conductor materials in silicon device manufacturing. Silicides of titanium (e.g., $TiSi_2$), cobalt ($CoSi_2$), nickel ($NiSi_2$) and various other metals have been employed successfully as conductor materials. When used in this manner, suicides combine the advantages of metals and polysilicon (also known as poly-Si, or just "poly"), exhibiting very low resistivity—significantly lower than poly-Si—and little or no electromigration.

Silicides are formed by means of an anneal (sintering) process known as "silicidation" that results in the formation of a metal-Si alloy (silicide) to act as a conductor or electrode. For example, Ti can be deposited on Si and annealed in an RTA (rapid thermal annealing) process to form $TiSi_2$. The silicide formation process begins at the interface between the Si and the deposited metal and "grows" outward from there. Any unconverted metal can then be removed by selective etching.

A self-aligning variant of the silicidation process, called "salicidation" or "salicide process" (terms formed by merging the letters "S" and "A" for "Self-Aligning" with the words "silicidation" and "silicide", respectively), is a process in which silicide conductors are formed only in those areas in which deposited metal (which after annealing becomes a metal component of the silicide) is in direct contact with silicon.

A silicide gate is typically formed by salicidation, in which a doped polysilicon gate is covered with a layer of silicide-forming metal (e.g. Co) and then converted to a metal silicide (by silicidation). A silicide gate conductor provides better device performance than a conventional polysilicon gate due to reduced gate dopant depletion, but the best overall performance is achieved only when the gate is fully and uniformly silicided. While many processes claim to produce "fully-silicided" gate conductors, their reliance on the "gradient" nature of silicide formation tends to produce non-uniform silicide composition in the gate (due to non-uniform conversion of gate polysilicon to silicide). It is generally difficult to convert polysilicon in the gate uniformly and completely into silicide because of long diffusion path and compressive stress due to volume expansion associated with the silicidation process. When polysilicon is not fully and uniformly converted to silicide, device performance is degraded and device-to-device parameter variation is increased due to device-to-device variations in the gate silicide composition.

Another issue (generally unrelated to gate silicidation) produced by continued downscaling of critical dimensions into the deep sub-micron range is that conventional lithographic patterning techniques are pushed beyond their minimum feature size limitations. It has become necessary to consider techniques for sub-lithographic feature patterning on semiconductor wafers (i.e., patterning feature sizes smaller than can be accomplished using convention lithographic techniques).

The current state of the art (and future CMOS technology) requires sub-50 nm metal conductors for connecting the CMOS devices, such as field effect transistors (FETs), to the back-end-of-line (BEOL) wiring. However, the currently available 0.93 numerical aperture (NA) lithographic tools can only resolve lithographic patterns with openings of 100 nm in diameter or greater. Future generations of 1.2 NA lithographic tools are expected to produce lithographic patterns with openings as small as 70 nm to 80 nm in diameter, but not nearly small enough to produce the desired 50 nm diameter. Without a means of producing the smaller, desired opening, maximum potential circuit density cannot be achieved. This is only one example of how conventional lithographic tools are at or beyond their limits in trying to produce certain desired semiconductor features, pointing to a need for sub-lithographic feature patterning.

Due to the challenges involved in fabricating nanostructures (nanometer-scale structures), new techniques and materials are constantly being sought to make nanofabrication (fabrication of nanostructures) easier, cheaper and more versatile. Thin films of materials called block copolymers show tremendous potential in this regard because they self-assemble into ordered, chemically distinct (i.e., micro-phase separated) domains with dimensions in the range of 10 to 40 nm. Block copolymer films can be used as templates (i.e., resists) for building nanostructures in semiconductor, optical and magnetic media materials, with sub-lithographic linewidths, margins and tolerances, and line-edge characteristics that are dictated by thermodynamics rather than standard resist processing.

The phenomenon of self-assembly is not unknown in nature. Some easily recognizable examples of self-assembly range from snowflakes to seashells to sand dunes, all of which form some type of regular or ordered patterns in response to specific external conditions. Self-assembling block copolymers behave in much the same way, but producing repeating patterns at nanometer scale dimensions.

Block copolymers are made up of blocks of different polymerized monomers. For example, PS-b-PMMA is short for polystyrene-b-poly(methyl methacrylate) and is made by first polymerizing styrene, and then subsequently polymerizing MMA. This polymer is a "diblock copolymer" because it contains two different chemical blocks. Triblocks, tetrablocks, pentablocks, etc., can also be made. Diblock copolymers are made using "living polymerization" techniques, such as atom transfer free radical polymerization (ATRP), reversible addition fragmentation chain transfer (RAFT), living cationic or living anionic polymerizations. Block copolymers are especially interesting in the present context because of their ability to "microphase separate" to form periodic nanostructures under the right thermodynamic conditions.

FIG. 1A is a plan view of a prior art structure 100 including a regular, patterned planar array of nanometer-scale vertical columns 104 of a first polymer formed within and surrounded on all sides by a planar layer of a second polymer 102. This regular patterned array is formed by self-assembly of a diblock copolymer comprising a mixture of the first and second copolymers, in this case polystyrene (columns 104) and PMMA (surrounding field 102).

FIG. 1B is a cross-sectional view of the prior art structure 100 described above with respect to FIG. 1A. The regular, patterned array of structures comprising nanometer-scale vertical polystyrene columns 104 and the surrounding planar field of PMMA 102 are formed on a surface of a substrate material 106. This substrate 106 can be a semiconductor wafer in process, an optical material or a magnetic media material.

Despite the usefulness of block copolymers for forming nanostructures on semiconductor wafers, they have not been shown to be particularly useful for present for patterning CMOS devices. Generally speaking, CMOS technology requires precise placement and registration of individual structural units in order to successfully form metal lines and vias in the wiring layers. The large, ordered arrays of nanometer-scale structures formed by self-assembling block copolymers may be regular, but their spatial frequency is dependent upon copolymer composition and for all practical purposes, their spatial "phase" is not predictable. As a result, the patterns produced by these self-assembling block copolymers lack the precise and predictable alignment and registration required to produce structures useful for lines and vias in CMOS technology.

SUMMARY OF THE INVENTION

It is therefore an object of the present inventive technique to provide fully and uniformly silicided MOS gate structures.

It is a further object of the present inventive technique to provide fully and uniformly silicided gate conductors in a manner which is applicable to and compatible with common CMOS processes.

It is a further object of the present inventive technique to accomplish foregoing objects while minimize extra processing steps.

It is a further object of the present inventive technique to reliably and predictably accomplish full conversion of gate polysilicon to silicide.

It is a further object of the present inventive technique to achieve a uniform silicide composition in MOS gate conductors.

According to the invention, fully silicided gate conductors with highly uniform silicide composition throughout the volume of the gate are formed by exposing top portions of previously formed polysilicon gate conductors, then "perforating" them deeply with sub-lithographic, sub-critical dimension, nanometer-scale "vias" (openings). A silicide-forming metal (e.g. cobalt, tungsten, etc.) is then deposited over the exposed polysilicon gates, covering them and filling the perforations. An RTA (rapid thermal annealing) process is then used to convert the polysilicon to silicide. Because of the extremely small, but deep perforations of the polysilicon gate conductor, a large amount of polysilicon surface area is in contact with the silicide-forming metal, and that area of contact extends throughout the volume of the polysilicon. This results in complete and very uniform silicidation of the polysilicon. The perforations, which would be impossible to create using conventional lithographic techniques, are formed by means of a thin layer of a self-assembling diblock copolymer. When annealed, the copolymer organizes itself into regular sub-lithographic nanometer-scale pattern of columns that is "developed" to remove the polymer component(s) that forms the columns, thereby leaving behind a pattern of nanometer-scale openings that can be used as a "template" for forming the perforations (by conventional etching techniques, such as RIE). A selective etch process ensures that only the exposed gate polysilicon is perforated. By its nature, the present inventive technique employs a self-aligning silicidation, or "salicidation" process.

According to one aspect of the invention, salicidation of source/drain conductors can be performed separately from gate salicidation. This is accomplished by salicidation at a point when the source, drain and gate conductors are all exposed. Because the gate conductor is very tall, compared to the height of the source/drain conductor regions, only a shallow top portion of the gate conductor is converted to silicide at this point. A nitride (e.g., $Si_3N_4$) liner is then disposed over the entire semiconductor device, an ILD (inter-layer dielectric, e.g., $SiO_2$) layer is formed and a CMP (chemical mechanical polish) process is used to polish back and planarize far enough to remove silicided portions of the gate conductors and exposing unconverted gate polysilicon. At this point, the only exposed, convertible silicon is the tops of the gate conductors. Next, the diblock copolymer is deposited (atop an organic underlayer and hardmask layer) and patterned by annealing. The copolymer layer is "developed" and the gate is perforated via a selective etch process. This process is described in greater detail hereinbelow. Silicidation of the perforated gate conductors is then performed.

According to another aspect of the invention, when gate silicidation is performed separately from source/drain conductor silicidation, a different silicide composition can be used for the gate conductor, e.g., by siliciding the gates using a different silicide-forming metal in silicidation of the polysilicon gate conductors from that used in silicidation of the source/drain conductors.

According to another aspect of the invention, silicidation of source/drain conductors and gate conductors can be performed at the same time, while still achieving complete and uniform silicidation of the gate polysilicon. This is accomplished by disposing a planarizing organic underlayer over the entire semiconductor device at a process point (immediately after forming gate "stacks") when source/drain conductors and gate conductors are all exposed. The gate conductor resides entirely above the level of the source/drain conductors. A hardmask layer is disposed over the underlayer, and a layer of self-assembling diblock copolymer is disposed atop the hardmask layer. The copolymer layer is annealed to form a repeating nanometer-scale pattern, then developed to for a pattern of nanometer-scale openings that are used as an etching template. The etch process is allowed to proceed through the underlayer and into the gate polysilicon until the gate polysilicon is perforated deeply, but stopping before reaching the thin gate dielectric. By stopping at this point, the source/drain conductors remain untouched. The remaining copolymer layer "template", the hardmask layer and the underlayer are all removed and salicidation of the source/drain conductors and gate conductors is performed. Because of die perforations, the gate polysilicon is fully and uniformly converted at the same time as the source/drain conductors are converted.

According to an aspect of the present invention, the formation of fully and uniformly silicided gate conductors on a semiconductor device can be accomplished by first providing a semiconductor device in-process at a point wherein one or more gate stacks have been formed on a silicon substrate. Each gate stack further comprises a gate conductor overlying a thin gate dielectric, with the thin gate dielectric spacing the gate conductor away from a corresponding channel region defined in the substrate. The gate conductor material can be polysilicon. At this point, the tops of the gate conductors and source/drain conductor regions are exposed. Next, silicidation is performed to convert the source/drain conductor regions and the tops of the gate conductors to silicide. (Since this process is inherently self-aligning, it is a "salicidation" process. Next, a liner layer is formed over the semiconductor device, and an ILD (dielectric) layer is formed over the liner layer and planarized. The planarization is allowed to continue until the surface is polished back far enough to remove the silicided top portions of the gate conductors, thereby exposing unconverted gate conductor material. A multi-layer material including a self-assembling diblock copolymer layer is deposited over the semiconductor device, and the copolymer layer is anneal to cause it to self-organize into a nanometer-scale pattern of polymer structures. A developing step (e.g., wet or dry etch) is then performed to transfer the pattern formed by the copolymer layer into a corresponding pattern of nanometer-scale openings in a mask layer (hardmask). A selective etch process is performed through the openings to create perforations extending into the gate conductors. Silicidation is then performed by depositing a silicide-forming metal over the semiconductor device. The metal fills the gate perforations, permitting the metal to reach into the volume of the gates. A subsequent anneal causes full and uniform silicidation of the gate conductors, e.g., by RTA (rapid thermal annealing).

According to an aspect of the invention, the multi-layer material includes a hardmask layer underlying the diblock copolymer layer.

According to another aspect of the invention, the multi-layer material includes an organic underlayer underlying the hardmask layer.

According to another aspect of the invention the liner layer is silicon nitride.

According to another aspect of the invention, the diblock copolymer is a PS-PMMA block copolymer.

According to various aspects of the invention, the silicide forming metal(s) can be selected from the set comprising Ni, Ti, Pt, Co, Ta and alloys that include those metals.

Another aspect of the inventive technique provides a slightly different method of forming fully and uniformly silicided gate conductors on a semiconductor device in-process, wherein silicidation of the gate conductors and the source/drain conductors is accomplished simultaneously. The semiconductor device has one or more gate stacks formed on a silicon substrate, each gate stack further comprising a gate conductor overlying a thin gate dielectric, with the thin gate dielectric spacing the gate conductor away from a corresponding channel region defined in the substrate. At this point, tops of the one or more gate conductors, and source/drain regions defined in the substrate are all exposed. A multi-layer material including a leveling layer and a self-assembling diblock copolymer layer is disposed over the semiconductor device and the diblock copolymer layer is annealed to cause it to organize itself into a repeating pattern of nanometer-scale polymer structures. The copolymer layer is then developed to eliminate the polymer structures, thereby creating a repeating pattern of nanometer-scale openings therein. A selective etching (e.g., a RIE—reactive ion etch) is performed through the openings in the copolymer layer to form nanometer-scale perforations extending into the one or more gate conductors, then the multi-layer material is removed. A silicide-forming metal is deposited over the semiconductor device, extending into and filling the gate conductor perforations and covering the now-exposed source and drain conductor regions. A salicidation step (e.g., by RTA) is performed to convert the one or more gate conductors and said source and drain regions to silicide simultaneously.

According to an aspect of the invention, a liner layer can be formed over the semiconductor device after the salicidation step. The liner layer can be silicon nitride.

According to another aspect of the invention, an inter-layer dielectric (ILD) can be disposed over the liner layer and planarized.

According to various aspects of the invention, the multi-layer material can include a hardmask layer underlying the diblock copolymer layer and the leveling layer can be an organic underlayer material.

According to another aspect of the invention, the diblock copolymer can be a PS-PMMA block copolymer.

According to various aspects of the invention, the silicide forming metal(s) can be selected from the set comprising Ni, Ti, Pt, Co, Ta and alloys that include those metals.

Other objects, features and advantages of the inventive technique will become evident in light of the ensuing description thereof.

BRIEF DESCRIPTION OF THE DRAWINGS

These and further features of the present invention will be apparent with reference to the following description and drawing, wherein.

DETAILED DESCRIPTION OF THE INVENTION

The present inventive technique produces fully silicided gate conductors with highly uniform silicide composition throughout the volume of the gate by exposing the tops of previously formed polysilicon gate conductors, then "perforating" them deeply with sub-lithographic, sub-critical dimension, nanometer-scale "vias" (openings). A silicide-forming metal (e.g. cobalt, tungsten, etc.) is then deposited over the exposed polysilicon gates, covering them and filling the perforations. An RTA (rapid thermal annealing) process is then used to convert the polysilicon to silicide. Because of the deep perforations, the surface area of polysilicon in contact with the silicide-forming metal is greatly increased over prior polysilicon conversion techniques. Not only is the total area of contact between the metal and unconverted polysilicon gate material increased, but the silicide-forming metal extends deep into the polysilicon and throughout its volume, resulting in substantial uniform silicidation of the polysilicon. Throughout this application, the word "uniform(ly)" means "substantially uniform(ly)" or "near uniform(ly)" and does not necessarily mean "completely uniform(ly)". Similarly, the word "fully" means "near fully" or "close to fully" and does not necessarily mean "absolutely fully". A self-assembling diblock copolymer is used to form a regular sub-lithographic nanometer-scale pattern that is used as a "template" for forming the perforations. A selective etch process ensures that only the exposed gate polysilicon is perforated. By its nature, the present inventive technique employs a self-aligning silicidation, or "salicidation" process.

The use of diblock copolymer patterning is particularly advantageous because it is capable of producing large, regular patterns of features smaller than critical dimensions of the MOS process (sub-critical), and far smaller than are possible using even the most advanced lithographic techniques. At the same time, the present inventive technique is highly insensitive to the exact spatial frequency and spatial phase of the gate perforations. Unlike the conductors and vias, which must be precisely and accurately registered over relatively large areas of a semiconductor wafer to be useful, uniform silicidation does not depend upon pattern registration (provided that the "perforations" are deep enough, sufficiently small in diameter and appropriately spaced).

Two basic variants of the present inventive technique are described herein: a first technique whereby source and drain silicidation is accomplished separately from gate silicidation, and a second technique whereby source, drain, and gate silicidation are all accomplished in the same processing step. The first technique permits (but does not require) formation of a gate conductor composed of a different silicide (e.g., by use of a different silicide-forming metal) from that used for source and drain conductors.

Figure 1A:
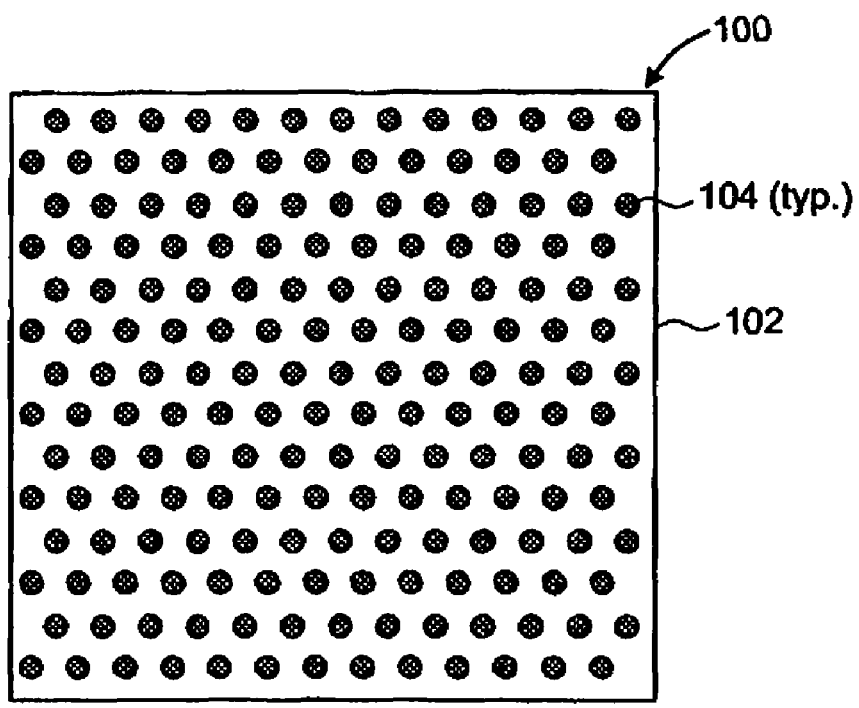
FIG. 1A is a plan view of a self-aligning, self-assembling co-polymer layer, in accordance with the prior art.
Figure 1B:
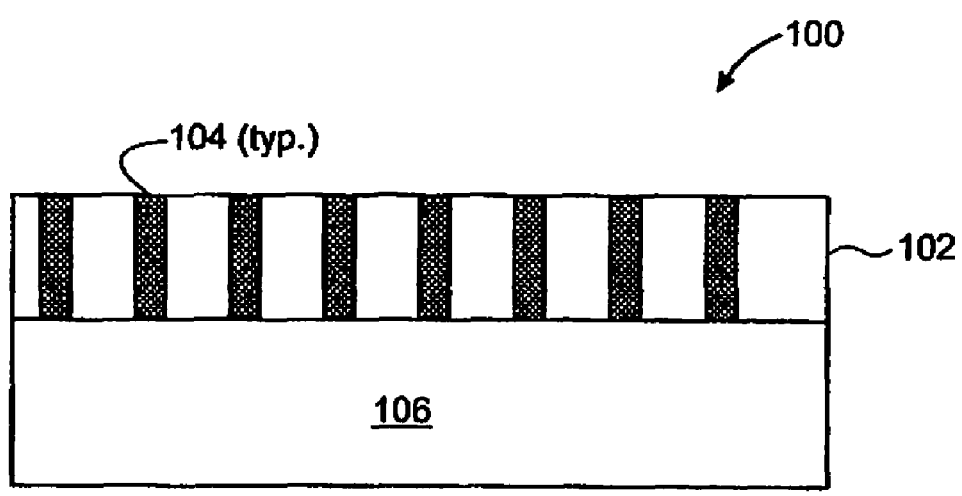
FIG. 1B is a cross-sectional view of the self-aligning, self-assembling co-polymer layer of FIG. 1A, in accordance with the prior art.
Figure 2A:
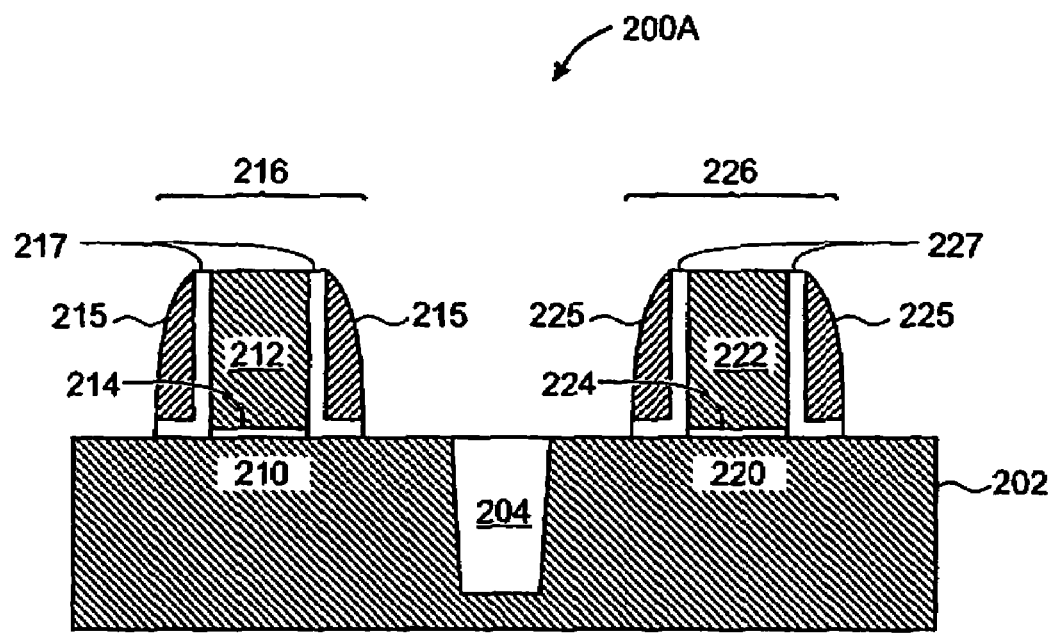
FIG. 2A is a cross-sectional view of an in-process semiconductor device, immediately after formation of MOS transistor gate "stacks", in accordance with the invention.

FIG. 2A is a cross-sectional view of an in-process semiconductor device 200A, immediately after formation of first and second MOS transistor gate "stacks" 216 and 226. In the figure, a substrate 202 has corresponding first and second channel regions (generally indicated by reference numbers 210 and 220, respectively) formed therein. The first gate stack 216 is formed over the first channel region 210 and the second gate stack 226 is formed over the second channel region 220. A shallow trench isolation (STI) region 204 is formed between the first and second channel regions 210 and 220 in the substrate 202, effectively isolating them from one another electrically.

The first gate stack 216 includes a first polysilicon gate conductor 212, spaced away from the first channel region 210 by a first thin gate dielectric 214. A first oxide spacer 217 (e.g., SiO$_2$) surrounds the first polysilicon gate conductor 212 and first thin gate dielectric 214. A nitride material (e.g., Si$_3$N$_4$) 215 left behind by previous processing covers and "buttresses" outer walls of the oxide spacer 217. The second gate stack 226 includes a second polysilicon gate conductor 222, spaced away from the second channel region 220 by a second thin gate dielectric 224. A second oxide spacer 227 surrounds the second polysilicon gate conductor 222 and second thin gate dielectric 224. A nitride material 225 left behind by previous processing covers and "buttresses" outer walls of the second oxide spacer 227.

Figure 2B:
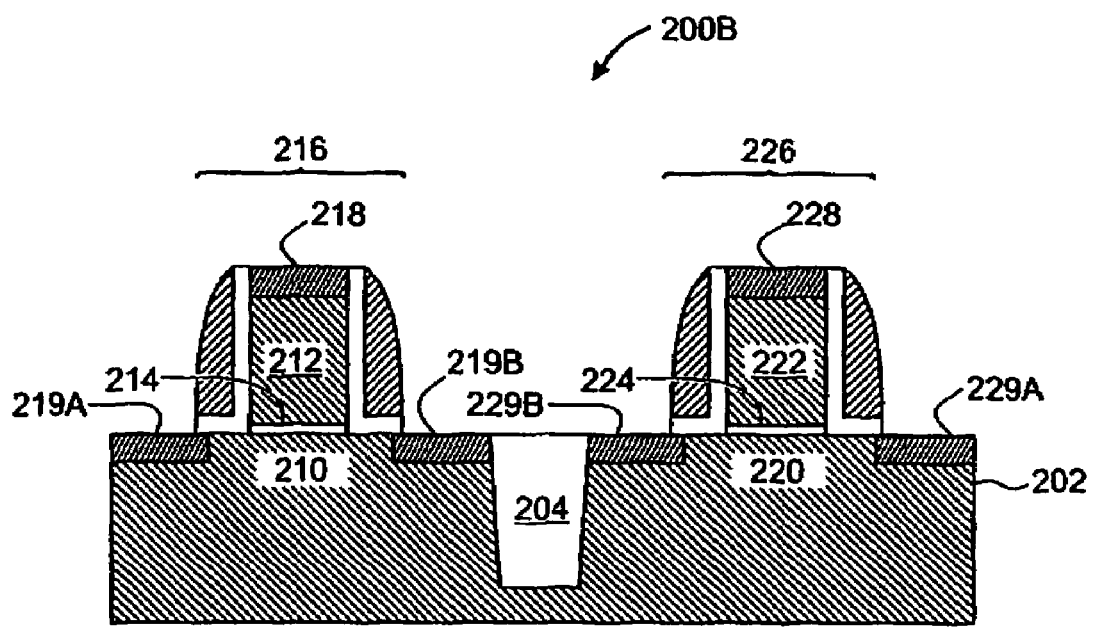
FIG. 2B is a cross-sectional view of the semiconductor device of FIG. 2A after a silicidation processing step, in accordance with the invention.

FIG. 2B is a cross-sectional view of a semiconductor device 200B, corresponding to the semiconductor device 200A of FIG. 2A after first a salicidation step to produce first silicide source/drain conductors 219A and 219B and second silicide source/drain conductors 229A and 229B. At the same time, silicide top portions 218 and 228 of the first and second polysilicon gate conductors 212 and 222, respectively, are formed. Because of the height of the gate conductors 212 and 222, only a small portion of the gate polysilicon is converted to silicide.

Figure 2C:
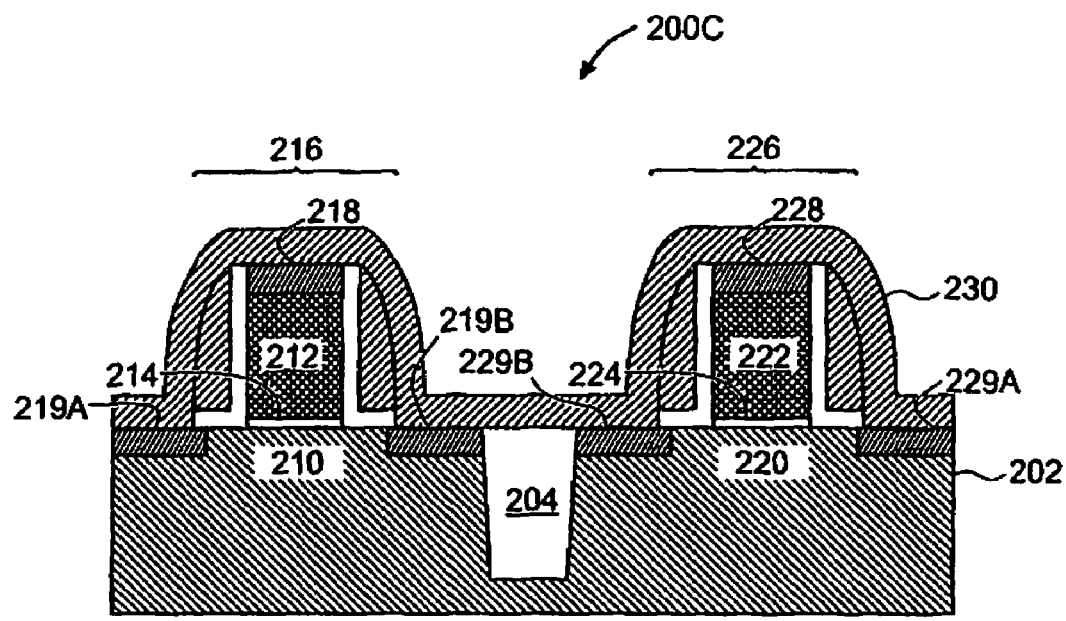
FIG. 2C is a cross-sectional view of the semiconductor device of FIG. 2B after a processing step to form a silicon nitride (Si$_3$N$_4$) liner, in accordance with the invention.

FIG. 2C is a cross-sectional view of a semiconductor device 200C, corresponding to the semiconductor device 200B of FIG. 2B after a processing step to form a silicon nitride (Si$_3$N$_4$) liner 230. The silicon nitride liner 230 covers the entire surface of the semiconductor device 200C, including the first and second gate stacks 216 and 226.

Figure 2D:
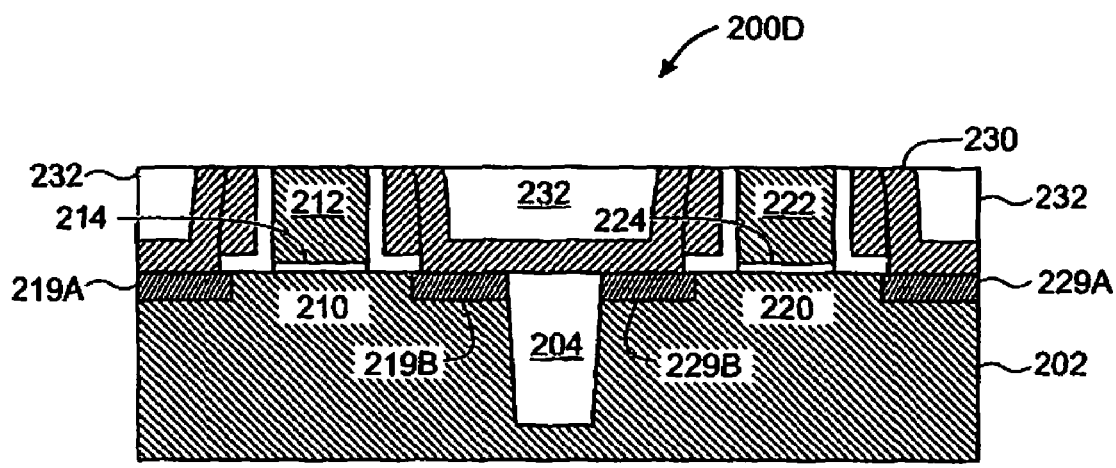
FIG. 2D is a cross-sectional view of the semiconductor device of FIG. 2C after deposition of inter-layer dielectric (ILD) and planarization, in accordance with the invention.

FIG. 2D is a cross-sectional view of a semiconductor device 200D, corresponding to the semiconductor device 200C of FIG. 2C after deposition of intra-layer dielectric (ILD, e.g. $SiO_2$) 232 and CMP (chem-mech polish) planarization. The planarization process completely removes the silicided top portions 218 and 228 of first and second polysilicon gate conductors 212 and 222, and exposes unconverted polysilicon gate material.

Figure 2E:
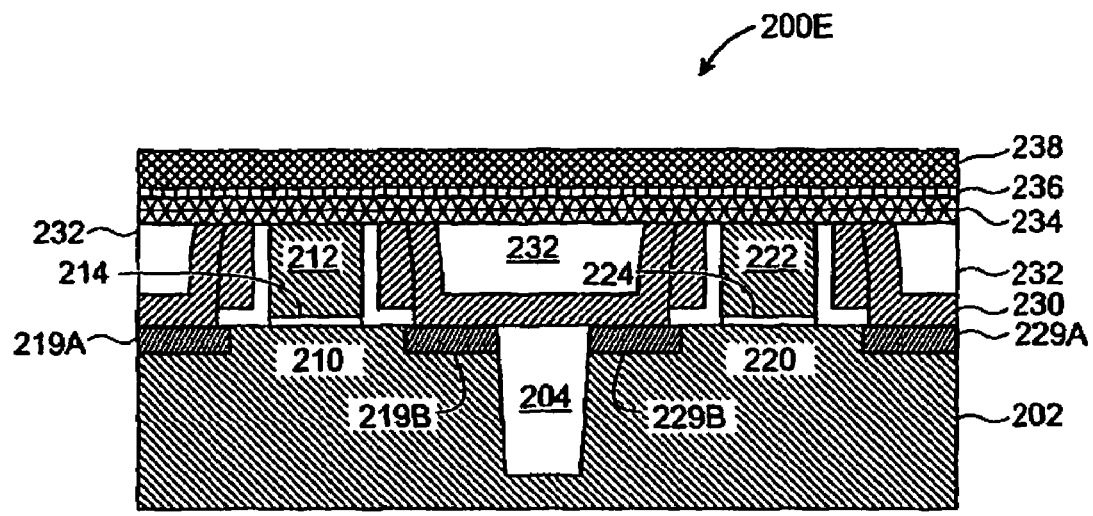
FIG. 2E is a cross-sectional view of the semiconductor device of FIG. 2D after deposition of an organic underlayer, a hardmask layer and a self-aligning, self-assembling co-polymer layer, in accordance with the invention.

FIG. 2E is a cross-sectional view of a semiconductor device 200E, corresponding to the semiconductor device 200D of FIG. 2D after deposition of an organic underlayer 234, followed by a hardmask layer 236 and a self-aligning, self-assembling diblock co-polymer layer 238. This diblock copolymer layer 238 can be, e.g., a PS-PMMA (Polystyrene-PMMA) diblock copolymer. Because the copolymer layer 238 is much thinner than the substrate, the use of the leveling (planarizing) organic underlayer 234 and hardmask layer 236 is indicated. The organic underlayer 234 serves two purposes: 1) to increase the process window (i.e., to lengthen the amount of time during which processing can occur) for a subsequent gate etch process; and 2) planarization.

Figure 2F:
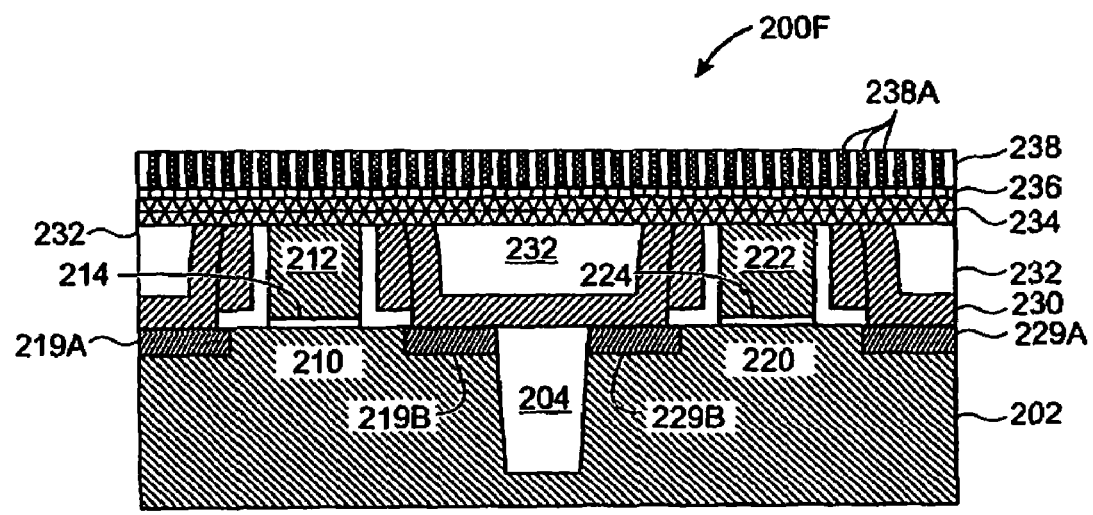
FIG. 2F is a cross-sectional view of the semiconductor device of FIG. 2E after annealing to pattern the co-polymer layer, in accordance with the invention.

FIG. 2F is a cross-sectional view of a semiconductor device 200F, corresponding to the semiconductor device 200E of FIG. 2E after annealing to pattern the diblock co-polymer layer 238, in accordance with the present inventive technique. The annealing process causes the diblock co-polymer 238 to organize itself into a repeating pattern, characterized by a regular array of regular, sub-lithographic, sub-critical dimension, repeating nanometer-scale columns 238A. In the specific case of the PS-PMMA diblock co-polymer, the columns are polystyrene.

Figure 2G:
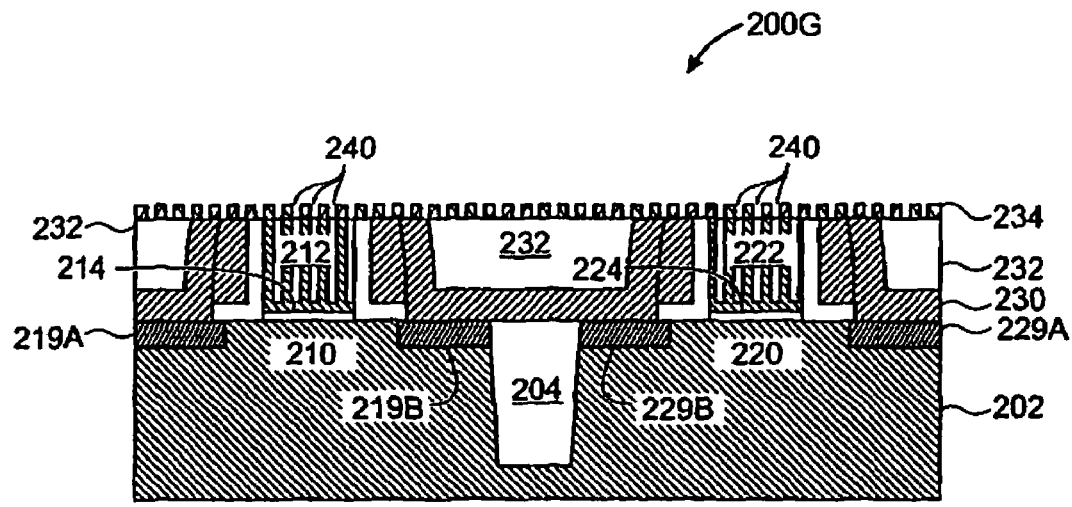
FIG. 2G is a cross-sectional view of the semiconductor device of FIG. 2F after selective etching to perforate the gate polysilicon, in accordance with the invention.

FIG. 2G is a cross-sectional view of a semiconductor device 200G, corresponding to the semiconductor device 200F of FIG. 2F, after developing and selective etching to perforate the first and second polysilicon gate conductors 212 and 222. In a development step, the polystyrene columns (238A, FIG. 2F) are removed, to leave a regular, repeating pattern of nanometer-scale openings 240 in the copolymer layer 238. Subsequent selective etching extends this pattern of openings through the hardmask layer 236. The etching process (preferably a highly selective RIE—reactive ion etch) effectively "drills" down into the polysilicon gates 212 and 222, using the pattern of openings 240 as a kind of "drilling template" to perforate through the hardmask layer 236, underlayer 234, and into the polysilicon gates 212 and 222 to create pattern of perforations 240 extending deep into the polysilicon gates 212 and 222.

Figure 2H:
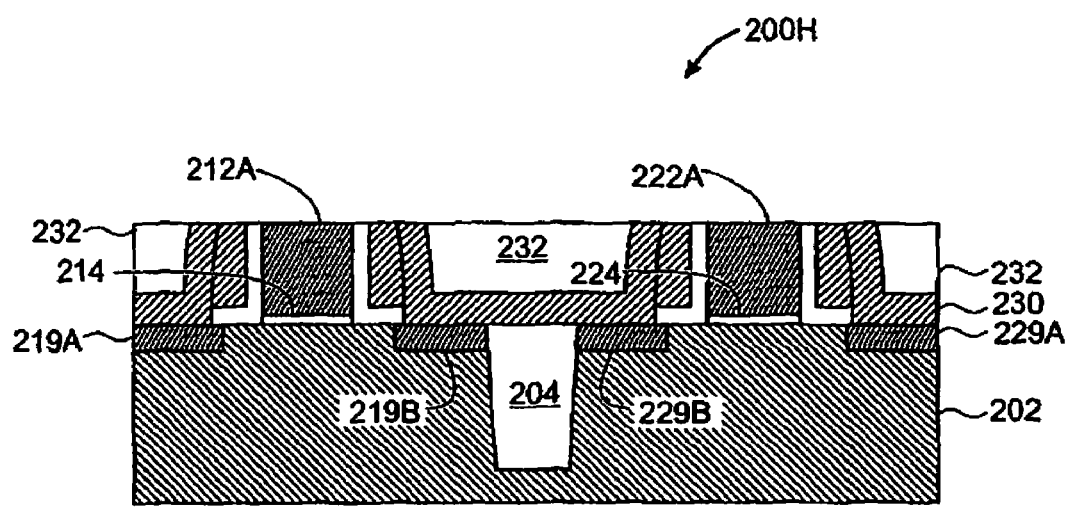
FIG. 2H is a cross-sectional view of the semiconductor device of FIG. 2G after silicidation and planarization, in accordance with the invention.

FIG. 2H is a cross-sectional view of a semiconductor device 200H, corresponding to the semiconductor device 200G of FIG. 2G after salicidation and planarization, in accordance with the invention. Salicidation is accomplished in conventional manner, by depositing a layer of silicide-forming metal and annealing. Preferably, the silicide-forming metal is Ni, Ti, Pt, Co or TaSi. The silicide-forming metal fills the openings (240, FIG. 2G) greatly increasing the area of contact between the polysilicon gate conductors 212 and 222 and penetrating deep thereinto. As a result, complete conversion of the gate polysilicon to a uniform silicide composition is readily accomplished via RTA, producing fully and uniformly silicided first and second gate conductors 212A and 212B as shown in the Figure. Planarization prepares the semiconductor device 200H for subsequent processing (e.g., formation of wiring layers, etc.).

The gate stacks 216 and 226 shown and described hereinabove with respect to FIGS. 2A-2H are representative of a typical CMOS process.

Because silicidation of the source/drain conductors and gate conductors is performed separately, the process described above with respect to FIGS. 2A-2H is capable of employing different silicide-forming metals while forming the silicide source/drain conductors (FIG. 2B) and silicide gate conductors (FIG. 2H). The use of different suicides permits different work functions to be applied to the drain/source and gate conductors, and causes different physical stresses. These differences can be used to advantage in separately optimizing source/drain and gate conductor properties.

A slightly different process flow is now described hereinbelow with respect to FIGS. 3A-3F, utilizing the present inventive technique to accomplish salicidation of source/drain conductors and gate conductors simultaneously.

Figure 3A:
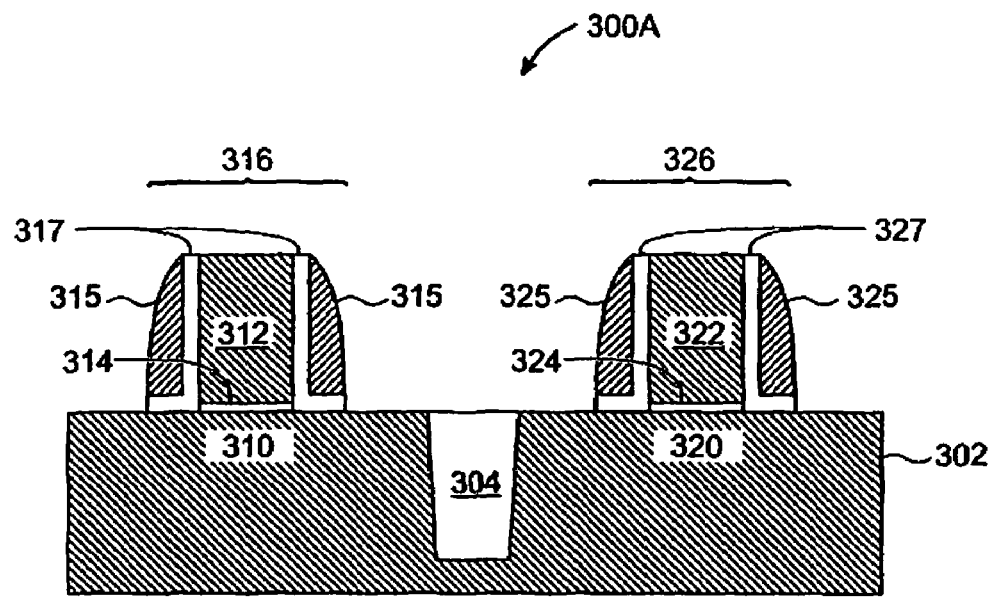
FIG. 3A is a cross-sectional view of an in-process semiconductor device, immediately after formation of MOS transistor gate "stacks", in accordance with the invention.

FIG. 3A is a cross-sectional view of an in-process semiconductor device 300A (compare 200A, FIG. 2A), immediately after formation of first and second MOS transistor gate "stacks" 316 and 326. This is essentially the same starting point as that shown and described hereinabove with respect to FIG. 2A. In the figure, a substrate 302 has corresponding first and second channel regions (generally indicated by reference numbers 310 and 320, respectively) formed therein. The first gate stack 316 is formed over the first channel region 310 and the second gate stack 326 is formed over the second channel region 320. A shallow trench isolation (STI) region 304 is formed between the first and second channel regions 310 and 320 in the substrate 302, effectively isolating them from one another electrically. The first gate stack 316 includes a first polysilicon gate conductor 312, spaced away from the first channel region 310 by a first thin gate dielectric 314. A first oxide spacer 317 surrounds the first polysilicon gate conductor 312 and first thin gate dielectric 314. A nitride material (e.g., $Si_3N_4$) 315 left behind by previous processing covers and "buttresses" outer walls of the first oxide spacer 317. The second gate stack 326 includes a second polysilicon gate conductor 322, spaced away from the second channel region 320 by a second thin gate dielectric 324. A second oxide spacer 327 surrounds the first polysilicon gate conductor 322 and second thin gate dielectric 324. A nitride material 325 left behind by previous processing covers and "buttresses" the walls of the second oxide spacer 327.

Figure 3B:
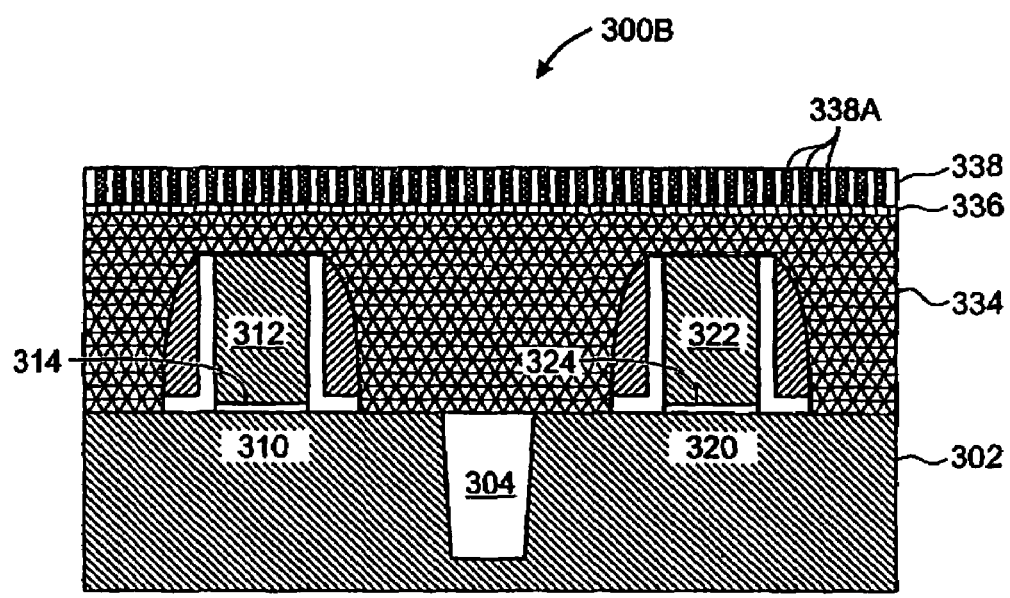
FIG. 3B is a cross-sectional view of the semiconductor device of FIG. 3A after deposition of an organic underlayer, hardmask, and self-aligning, self-assembling co-polymer layer, in accordance with the invention.

FIG. 3B is a cross-sectional view of a semiconductor device 300B, corresponding to the semiconductor device 300A of FIG. 3A after deposition and planarization of an organic underlayer 334, hardmask layer 336, and self-aligning, self-assembling co-polymer layer 338, in accordance with the invention. The co-polymer layer 338 has been annealed, causing it to organize itself into a repeating pattern, characterized by a regular array of regular, sub-lithographic, sub-critical dimension, repeating nanometer-scale columns 338A. (compare 238, 238A, FIG. 2F).

Figure 3C:
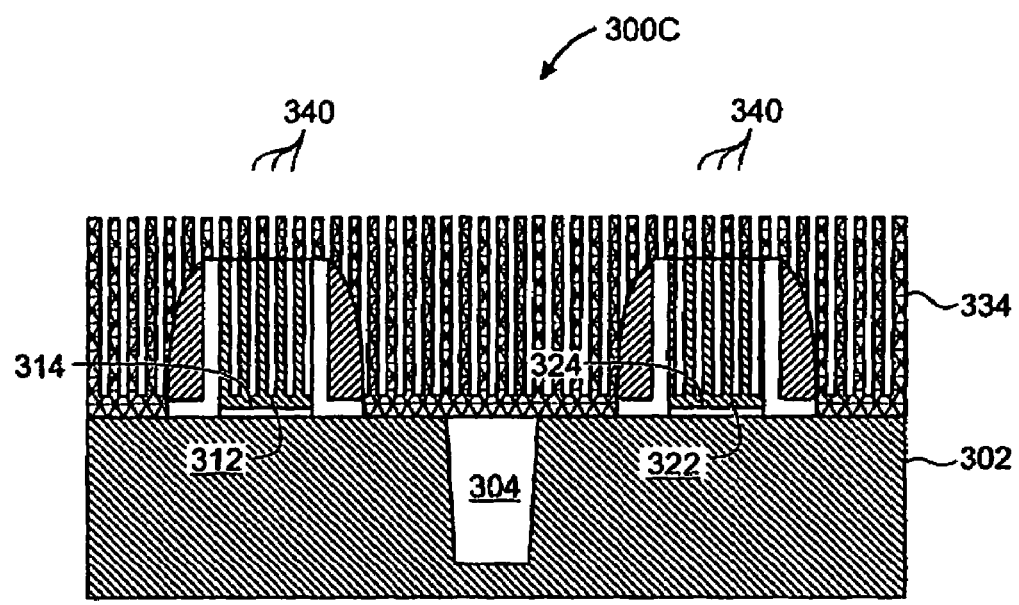
FIG. 3C is a cross-sectional view of the semiconductor device of FIG. 3B after selective etching to perforate the gate polysilicon, in accordance with the invention.

FIG. 3C is a cross-sectional view of a semiconductor device 300C, corresponding the semiconductor device 300B of FIG. 3B after development and etching. Development of the copolymer layer 338 removes the polystyrene columns 338A. A subsequent etching process (preferably including a highly selective RIE—reactive ion etch) effectively "drills" down into the polysilicon gates 312 and 322, using the pattern of openings as a kind of "drilling template" to cut through the hardmask 336, the underlayer 334, and into the polysilicon gates 312 and 322 to create a pattern of perforations 340 extending deep into the polysilicon gates 312 and 322. The selective etch process is adapted (e.g., by timing and/or by material selectivity) to stop before penetrating deep enough to reach the gate dielectrics (314, 324) and silicon substrate 302.

Figure 3D:
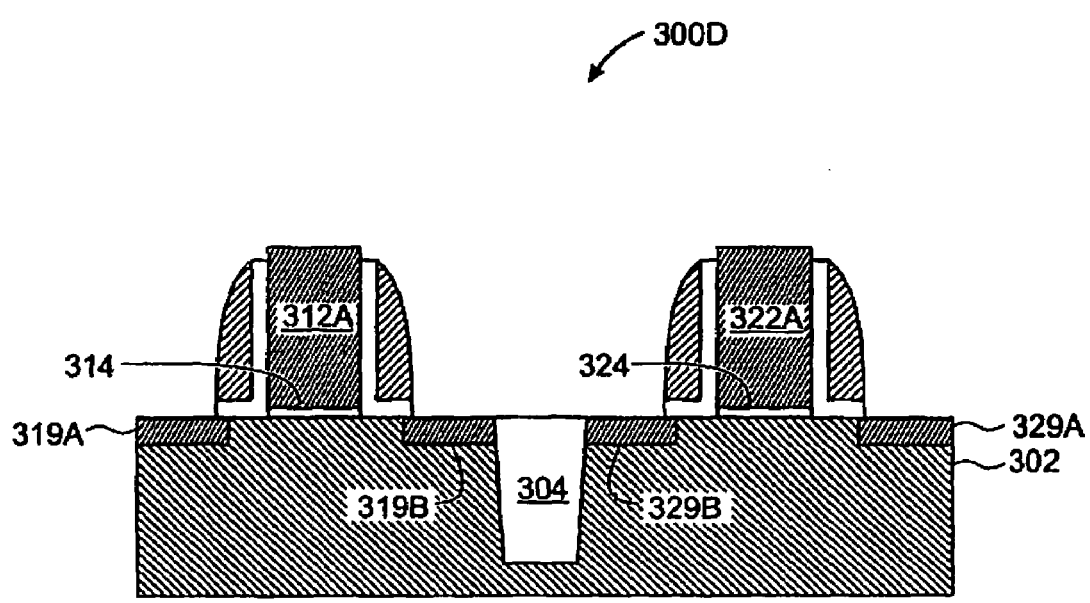
FIG. 3D is a cross-sectional view of the semiconductor device of FIG. 3C after removal of the organic underlayer, hardmask and co-polymer layer, and after silicidation, in accordance with the invention.

FIG. 3D is a cross-sectional view of a semiconductor device 300D, corresponding to the semiconductor device 300C of FIG. 3C after removal of the organic underlayer 334, hardmask 336 and remaining co-polymer layer 338, and after salicidation. The salicidation process forms silicide source/drain conductors 319A, 319B, 329A and 329B and fully and uniformly silicided gate conductors 312A and 322A simultaneously.

Figure 3E:
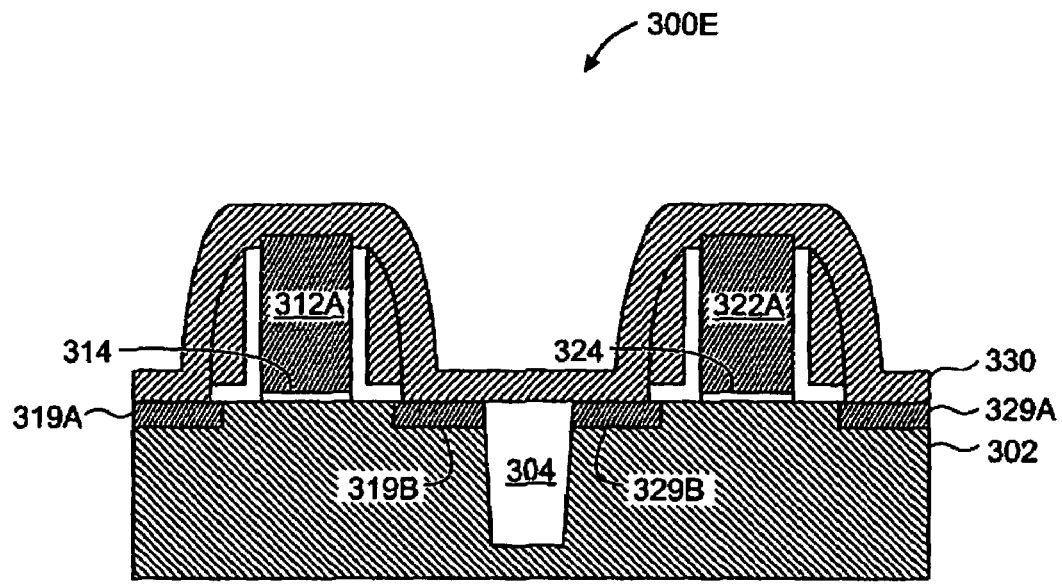
FIG. 3E is a cross-sectional view of the semiconductor device of FIG. 3D after formation of a silicon nitride (Si$_3$N$_4$) liner, in accordance with the invention.

FIG. 3E is a cross-sectional view of a semiconductor device 300E, corresponding to the semiconductor device 300D of FIG. 3D after formation of a silicon nitride ($Si_3N_4$) liner 330, in accordance with the invention.

Figure 3F:
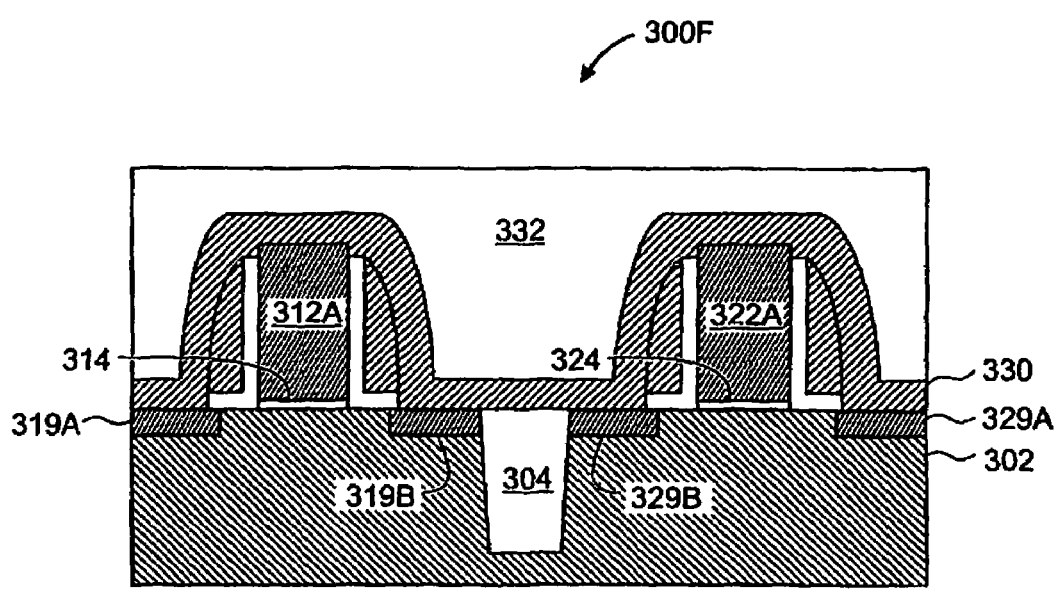
FIG. 3F is a cross-sectional view of the semiconductor device of FIG. 3E after deposition of an inter-layer dielectric (ILD) material.

FIG. 3F is a cross-sectional view of a semiconductor device 300F, corresponding to the semiconductor device 300E of FIG. 3E after deposition and planarization of an inter-layer dielectric (ILD) material 332. At this point, the semiconductor device 300F is ready for further processing (e.g., formation of wiring layers, etc.).

This second processing technique, as described hereinabove with respect to FIGS. 3A-3F, has some specific advantages. Compared to the first technique described hereinabove with respect to FIGS. 2A-2H, this second method maintains gate height because there is no CMP process. Further, this second techniques allows more liner deposition because the gate height is not reduced during processing. The main advantage of the relatively taller gate is that it results in lower gate resistance. The advantage of more liner deposition is related to the liner's role as a stress (tensile or compressive) inducing material. The application of physical stress can be used to enhance transistor performance. For example, compressive stress along the device channel increases drive current in p-type FETs and decreases drive current in n-type FETs. Tensile stress along the device channel increases drive current in n-type FETs and decrease drive current in p-type FETs. Depending on the conductivity type of FET (i.e., p or n), the stress liner can be under tensile stress (preferred for nFETs) or compressive stress (preferred for pFETs).

Since the second technique (FIGS. 3A-3F) doesn't involve a CMP step and no liner material is removed, physical stress applied to the gate using this technique is higher than the when using the first technique. The greater stress can be used to improve device performance.

A key aspect of the present inventive technique is the ability to form nanometer-scale "perforations" in gate polysilicon with dimensions well below critical dimensions for the process, and well below minimum dimensions that would be achievable by lithographic techniques. It is the perforation of the gate polysilicon that permits uniform silicidation of a relatively tall gate conductor. Such complete and uniform silicidation/salicidation would not be possible without the ability to deposit silicide-forming metal to be deposited deep into and throughout the volume of the gate polysilicon.

One of the more significant advantages of the present inventive technique is that it provides a predictable, reliable method for forming all-silicide gate conductors of uniform composition. As a result, not only are the usual benefits of silicide gate conductors realized, but more consistent device-to-device performance parameters are achieved as compared to devices fabricated by processes that produce non-uniform silicide gate composition.

The present inventive technique is described above with respect to a PS-PMMA diblock copolymer that produces vertical columnar structures (i.e., columnar structures that are substantially perpendicular to the plane of the copolymer layer). In plan view, these columnar structures appear essentially round (i.e., they have a substantially circular cross-section when viewed perpendicular to the plane of the co-polymer layer), suggesting a cylindrical shape. It will be immediately understood by those of ordinary skill in the art that the exact shape of the columnar structures is unimportant. It is only important that at least one element of the copolymer can be removed (e.g., by chemical development), leaving behind a suitably patterned "resist" that can be used for subsequent "perforation" of the gate polysilicon by etching. The includes any diblock copolymer, triblock copolymer, etc., which can be "developed" to produce a pattern of nanometer-scale openings suitable for perforation of the gate with holes, slits, or any other suitable shape could readily be substituted. Any such substitution is fully within the spirit and scope of the present invention.

Those of ordinary skill in the art will immediately understand and appreciate that semiconductor processing techniques such as the present inventive technique are intended to be performed on automated equipment under computer control. This control of the automated equipment is guided by a set of instructions, said instructions usually provided on a computer readable medium such as a disk or tape, or via an electronic transfer medium such as a computer network or the Internet. It is fully within the spirit and scope of the present invention to embody instructions for controlling automated equipment to form the semiconductor structure(s) and device(s) described hereinabove in computer readable form on such computer readable media or electronic transfer media.

Although the invention has been shown and described with respect to a certain preferred embodiment or embodiments, certain equivalent alterations and modifications will occur to others skilled in the art upon the reading and understanding of this specification and the annexed drawings. In particular regard to the various functions performed by the above described inventive components the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more features of the other embodiments as may be desired and advantageous for any given or particular application.

What is claimed is:

1. A method of forming fully and uniformly silicided gate conductors on a semiconductor device, comprising the steps of:

providing a semiconductor device comprising a silicon substrate and one or more gate stacks formed on the silicon substrate, said one or more gate stacks each further comprising a gate conductor overlying a thin gate dielectric, said thin gate dielectric spacing the gate conductor away from a corresponding channel region defined in the silicon substrate;

disposing a layer of a self-assembling diblock copolymer overlying the one or more gate conductors;

annealing the diblock copolymer layer to cause it to organize itself into a repeating pattern of nanometer-scale polymer structures;

developing the diblock copolymer layer to form a repeating pattern of nanometer-scale openings therein;

selectively etching, using the developed copolymer layer as an etching template, to form nanometer-scale perforations extending into the one or more gate conductors, then filling the nanometer-scale perforations with a silicide-forming metal by depositing the silicide-forming metal over the one or more gate conductors; and saliciding to convert said one or more gate conductors to silicide.

2. A method according to claim 1, wherein the one or more gate conductors are polysilicon prior to salicidation.

3. A method according to claim 1, wherein saliciding is accomplished by means of a high-temperature rapid thermal anneal (RTA).

4. A method according to claim 1, wherein said diblock copolymer is a PS-PMMA block copolymer.

5. A method according to claim 1, wherein the silicide-forming metal is selected from the group consisting of Ni, Ti, Pt, Co, Ta and alloys of said metals.

6. A method according to claim 1, wherein the selective etch process includes a reactive ion etch (RIE).

7. A fully and uniformly silicided gate conductor on a semiconductor device, the gate conductor comprising a plurality of perforations, said gate conductor formed by:

providing a semiconductor device comprising a silicon substrate and one or more gate stacks formed on the silicon substrate, said one or more gate stacks further comprising a gate conductor overlying a thin gate dielectric, said thin gate dielectric spacing the gate conductor away from a corresponding channel region defined in the silicon substrate;

disposing a layer of a self-assembling diblock copolymer overlying the one or more gate conductors;

annealing the diblock copolymer layer to cause it to organize itself into a repeating pattern of nanometer-scale polymer structures;

developing the diblock copolymer layer to form a repeating pattern of nanometer-scale openings therein;

selectively etching, using the developed copolymer layer as an etching template, to form nanometer-scale perforations extending into the one or more gate conductors, then filling the nanometer-scale perforations with a silicide-forming metal by depositing the silicide-forming metal over the one or more gate conductors; and saliciding to convert said one or more gate conductors to silicide.

8. A fully and uniformly silicided gate conductor according to claim 7, wherein the one or more gate conductors are polysilicon prior to salicidation.

9. A fully and uniformly silicided gate conductor according to claim 7, wherein saliciding is accomplished by means of a high-temperature rapid thermal anneal (RTA).

10. A fully and uniformly silicided gate conductor according to claim 7, wherein said diblock copolymer is a PS-PMMA block copolymer.

11. A fully and uniformly silicided gate conductor according to claim 7, wherein the silicide-forming metal is selected from the group consisting of Ni, Ti, Pt, Co, Ta and alloys of said metals.

12. A fully and uniformly silicided gate conductor according to claim 7, wherein the selective etch process includes a reactive ion etch (RIE).

13. A fully and uniformly silicided gate conductor according to claim 7, wherein a hardmask layer is disposed overlying the one or more gate conductors prior to disposing the diblock copolymer layer.

14. A method of forming fully and uniformly silicided gate conductors on a semiconductor device, comprising the steps of:

providing a semiconductor device comprising a silicon substrate and one or more gate stacks formed on the silicon substrate, said one or more gate stacks each further comprising a gate conductor overlying a thin gate dielectric, said thin gate dielectric spacing the gate conductor away from a corresponding channel region defined in the substrate, said channel region having source and drain regions defined at opposite ends thereof;

disposing a leveling layer over the semiconductor device;

disposing a self-assembling diblock copolymer layer overlying the leveling layer;

annealing the diblock copolymer layer to cause it to organize itself into a repeating pattern of nanometer-scale polymer structures;

developing the diblock copolymer layer to form a repeating pattern of nanometer-scale openings therein;

selectively etching through the openings in the copolymer layer to form nanometer-scale perforations extending into the one or more gate conductors;

filling the nanometer-scale perforations with a silicide-forming metal by depositing the silicide-forming metal over the semiconductor device; and saliciding to convert said one or more gate conductors and said source and drain regions to silicide.

15. A method according to claim 14, wherein said one or more gate conductors are polysilicon prior to salicidation.

16. A method according to claim 14, further comprising the step of disposing a hardmask layer overlying the organic layer prior to disposing the diblock copolymer layer.

17. A method according to claim 14, wherein the selective etch process further comprises the step of transferring the pattern of openings in the copolymer layer to the hardmask layer.

18. The method according to claim 14, wherein said salicidation step comprises a high-temperature rapid thermal anneal (RTA).

19. A method according to claim 14, wherein said diblock copolymer is a PS-PMMA block copolymer.

20. A method according to claim 14, wherein the silicide-forming metal is selected from the group consisting of Ni, Ti, Pt, Co, Ta and alloys of said metals.

21. A method according to claim 14, wherein the selective etch process includes a reactive ion etch (RIE).

22. A fully and uniformly silicided gate conductor on a semiconductor device, the gate conductors comprising a plurality of perforations, said gate conductor formed by:

providing a semiconductor device comprising a silicon substrate with one or more gate stacks formed on the silicon substrate, said one or more gate stacks further comprising a gate conductor overlying a thin gate dielectric, said thin gate dielectric spacing the gate conductor away from a corresponding channel region defined in the substrate, said channel region having source and drain regions defined at opposite ends thereof;

disposing an leveling layer over the semiconductor device;

disposing a self-assembling diblock copolymer layer overlying the leveling layer;

annealing the diblock copolymer layer to cause it to organize itself into a repeating pattern of nanometer-scale polymer structures;

developing the diblock copolymer layer to form a repeating pattern of nanometer-scale openings therein;

selectively etching through the openings in the copolymer layer to form nanometer-scale perforations extending into the said one or more gate conductors;

filling the nanometer-scale perforations with a silicide-forming metal by depositing the silicide-forming metal over the semiconductor device; and saliciding to convert said one or more gate conductors and said source and drain regions to silicide.

23. A fully and uniformly silicided gate conductor according to claim 22, wherein said one or more gate conductors are polysilicon prior to salicidation.

24. A fully and uniformly silicided gate conductor according to claim 22, wherein a hardmask layer is disposed overlying the organic layer prior to disposing the diblock copolymer layer.

25. A fully and uniformly silicided gate conductor according to claim 22, wherein the selective etch process further comprises the step of transferring the pattern of openings in the copolymer layer to the hardmask layer.

26. A fully and uniformly silicided gate conductor according to claim 22, wherein said salicidation step comprises a high-temperature rapid thermal anneal (RTA).

27. A fully and uniformly silicided gate conductor according to claim 22, wherein said diblock copolymer is a PS-PMMA block copolymer.

28. A fully and uniformly silicided gate conductor according to claim 22, wherein the silicide-forming metal is selected from the group consisting of Ni, Ti, Pt, Co, Ta and alloys of said metals.

29. A fully and uniformly silicided gate conductor according to claim 22, wherein the selective etch process includes a reactive ion etch (RIE).

* * * * *